(12) United States Patent  
Cheng et al.

(10) Patent No.: US 7,821,353 B2
(45) Date of Patent: Oct. 26, 2010

(54) DIRECTIONAL COUPLER

(75) Inventors: Kuang-Wei Cheng, Taipei Hsien (TW); Hsin-Ping Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 185 days.

(21) Appl. No.: 12/195,390

(22) Filed: Aug. 20, 2008

(65) Prior Publication Data

US 2009/0295499 A1 Dec. 3, 2009

(30) Foreign Application Priority Data

Jun. 2, 2008 (CN) .......................... 2008 1 0301935

(51) Int. Cl.
*H01P 5/18* (2006.01)
*H01P 7/38* (2006.01)

(52) U.S. Cl. ....................................... 333/116; 333/112
(58) Field of Classification Search .................. 333/109, 333/110, 111, 112, 115, 116, 117, 238
See application file for complete search history.

(56) References Cited

U.S. PATENT DOCUMENTS 7,525,397 B2 * 4/2009 Schmidt ...................... 333/116

OTHER PUBLICATIONS

J.L. Li et al., Microstrip directional coupler with flat coupling and high isolation, Feb. 2007, Electronic Letters, vol. 43 No. 4, 2 pages.*

* cited by examiner

*Primary Examiner*—Dean O Takaoka
(74) *Attorney, Agent, or Firm*—Frank R. Niranjan

(57) ABSTRACT

A directional coupler includes two parallel coupled lines and two sector metal plates. The two sector metal plates are connected to a middle portion of each of the two coupled lines. Central angles of the two sector metal plate are less than 90 degrees.

5 Claims, 7 Drawing Sheets

DIRECTIONAL COUPLER

BACKGROUND

1. Field of the Invention

The present invention relates to a coupler, and more particularly to a directional coupler.

2. Description of related art

Directional couplers are used in a wide variety of applications and can satisfy almost any requirement for sampling incident and reflected microwave power conveniently and accurately with minimal disturbance to the transmission line. Directional couplers are often positioned on a printed circuit board (PCB) to help minimize disturbance between signals on the PCB.

However, a PCB often comprises a plurality of components, such as resistors, capacitors, and transistors making space on the PCB an issue for a PCB designer in order to incorporate a directional coupler onto the PCB design. FIG. 1 shows one such directional coupler including two parallel coupled lines 10 printed on a printed circuit board (PCB) 35. Each of the coupled lines 10 are elongated and made of conductive material, such as copper. The length of each of the coupled lines may be 180 mils so as to reduce space on the PCB.

What is desired, therefore, is to provide a directional coupler that will remedy the above mentioned deficiencies.

DETAILED DESCRIPTION

Figure 1:
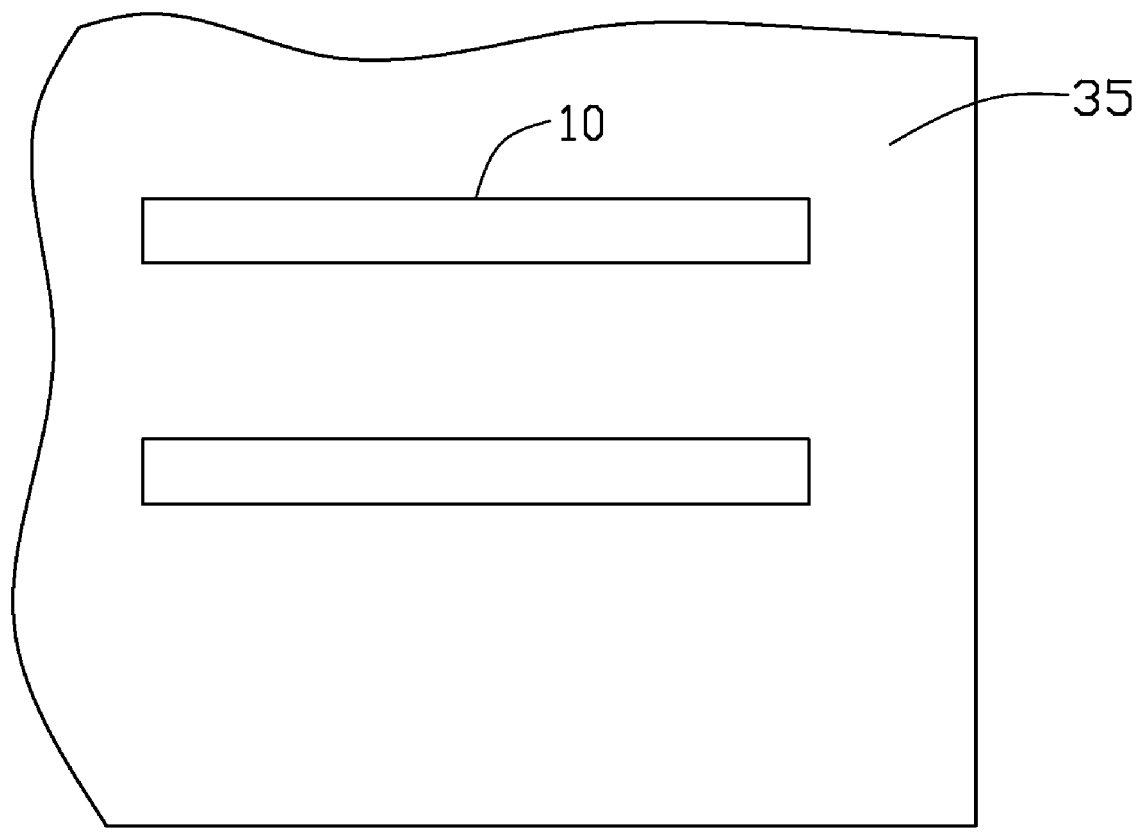
FIG. 1 is a plane schematic diagram of a directional coupler printed on a PCB.
Figure 2:
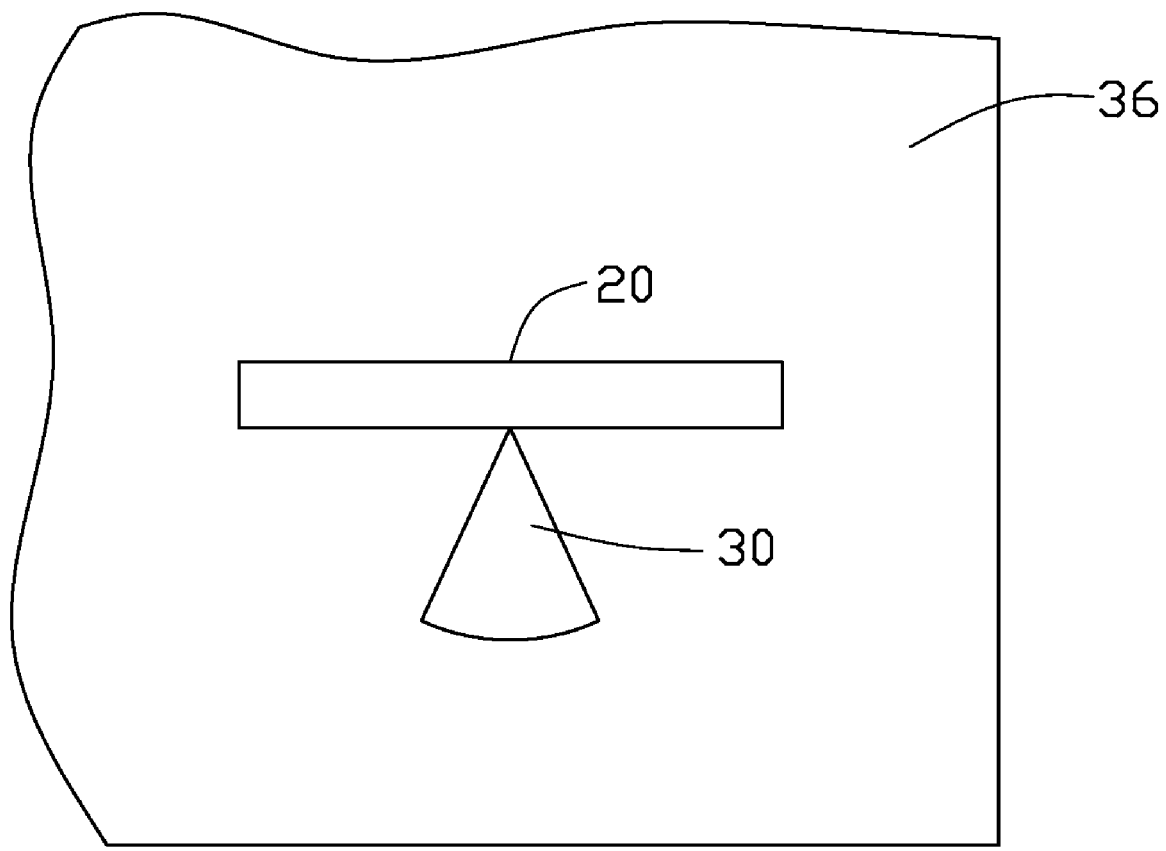
FIG. 2 is a plane schematic diagram of a coupled line of the directional coupler in accordance with an embodiment of the present disclosure.

FIG. 2 is a plane schematic diagram of a coupled line of the directional coupler in accordance with one embodiment of the present invention. In one embodiment, a sector metal plate 30 is connected to the middle position of a coupled line 20. A central angle of the sector metal plate 30 is less than 90 degrees. The sector metal plate 30 and the coupled line 20 are printed on a PCB 36.

In one particular embodiment, the length of the coupled line 20 may be approximately 150 mils. The radius of the sector metal plate 30 may be approximately 71.47 mils. The central angle of the sector metal plate 30 may be approximately 60 degrees. It may be understood that he parameters of the sector metal plate 30 can be adjusted as needed to satisfy the requirements of the capacitor equivalent.

Figure 3:
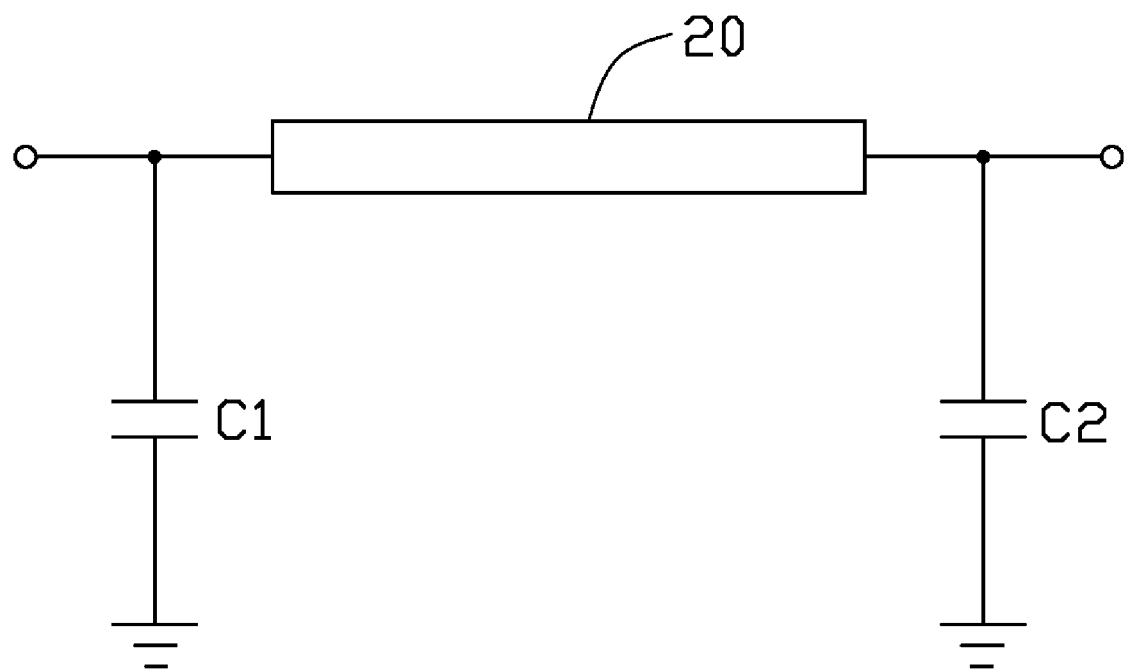
FIG. 3 is an equivalent plane schematic diagram of one embodiment of a coupled line of FIG. 2.

FIG. 3 illustrates two opposite ends of the coupled line 20 of FIG. 2. In FIG. 3, the two opposite ends are retracted a same distance toward the middle position thereof to form the coupled line 20. In one exemplary embodiment, the length of the coupled line may be approximately 150 mils. Two terminals of the coupled line 20 are connected to capacitors C1 and C2 to make the retracted coupled line 20 equivalent to the coupled line 10. In one embodiment, the capacitances of the capacitors C1 and C2 may be substantially equal.

Figure 4:
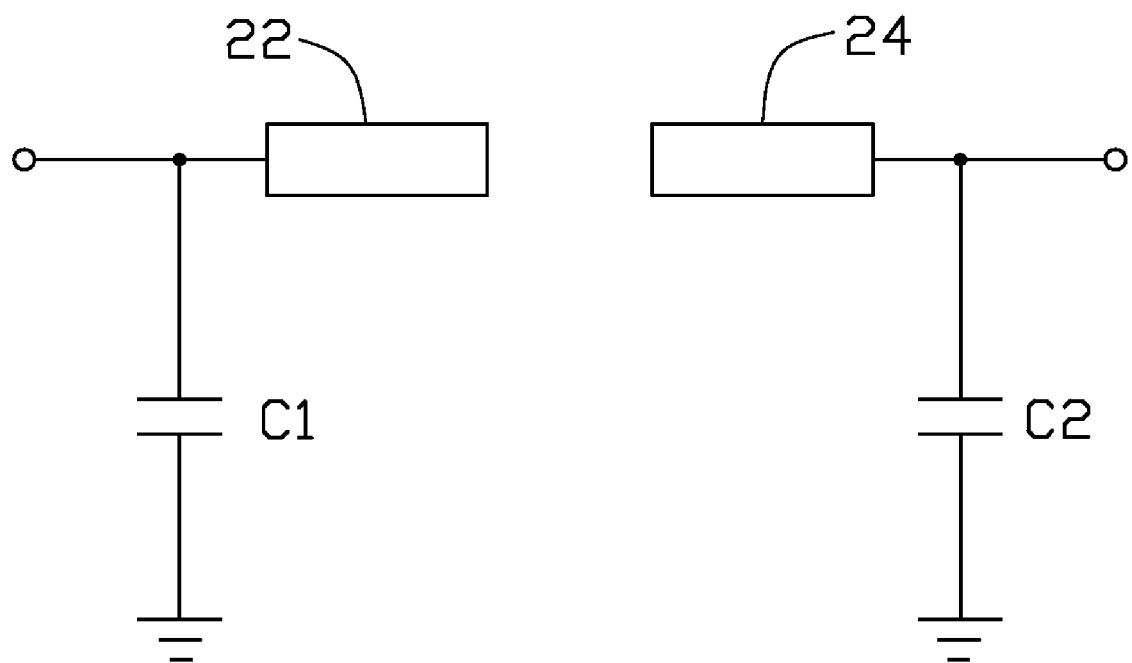
FIG. 4 is an equivalent plane one embodiment of schematic diagram of FIG. 3.

The coupled line 20 of FIG. 3 can be divided into two coupled lines 22 and 24 as shown in FIG. 4. The capacitor C1 is connected between one terminal of the coupled line 22 and the ground. The capacitor C2 is connected to one terminal of the coupled line 24. The one terminal of the coupled line 22 and the one terminal of the coupled line 24 are spaced apart from each other.

Figure 5:
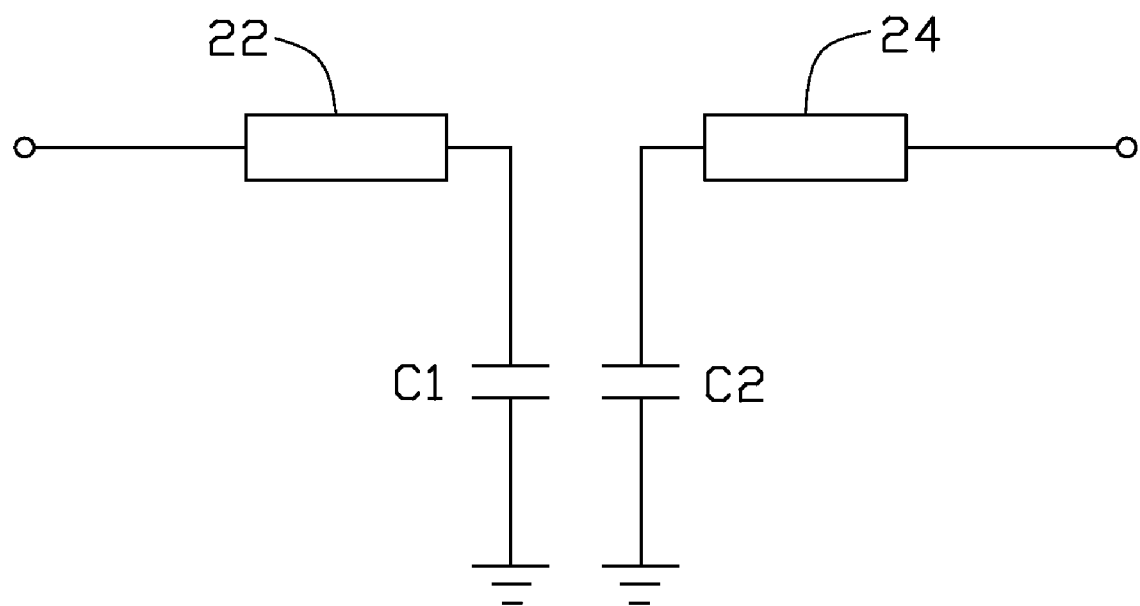
FIG. 5 is an equivalent plane one embodiment of schematic diagram of FIG. 4.
Figure 6:
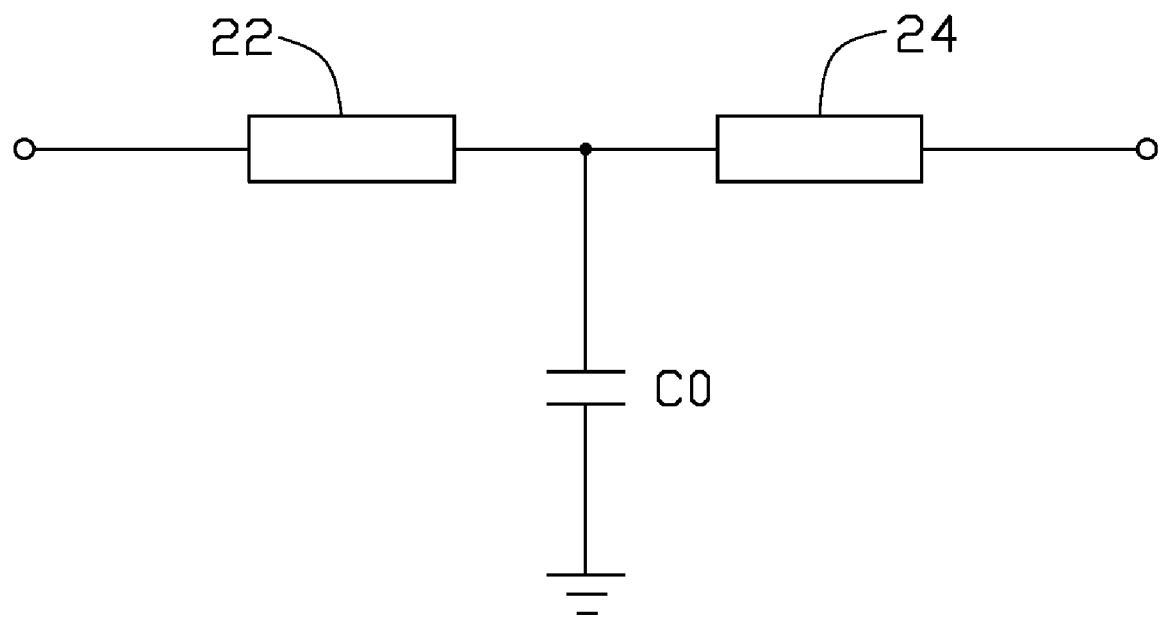
FIG. 6 is an equivalent plane one embodiment of schematic diagram of FIG. 5.

Referring to FIG. 5, the capacitors C1 and C2 of FIG. 4 can be moved to connect to adjacent terminals of the coupled lines 22 and 24 according to the symmetry principle. Namely the capacitor C1 and the coupled line 22 are equal to the capacitor C2 and the coupled line 24 respectively at the middle line between coupled line 22 and the coupled line 24. Referring to FIG. 6, a capacitor C0 is connected between a node between the two coupled lines 22, 24 and the ground to replace the capacitors C1 and C2 because the capacitors C1 and C2 are connected in parallel. The capacitance of the capacitor C0 is the sum of the capacitances of the capacitors C1 and C2. The sector metal plate 30 (see FIG. 2) can replace the capacitor C0 due to its capacitor characteristics.

Figure 7:
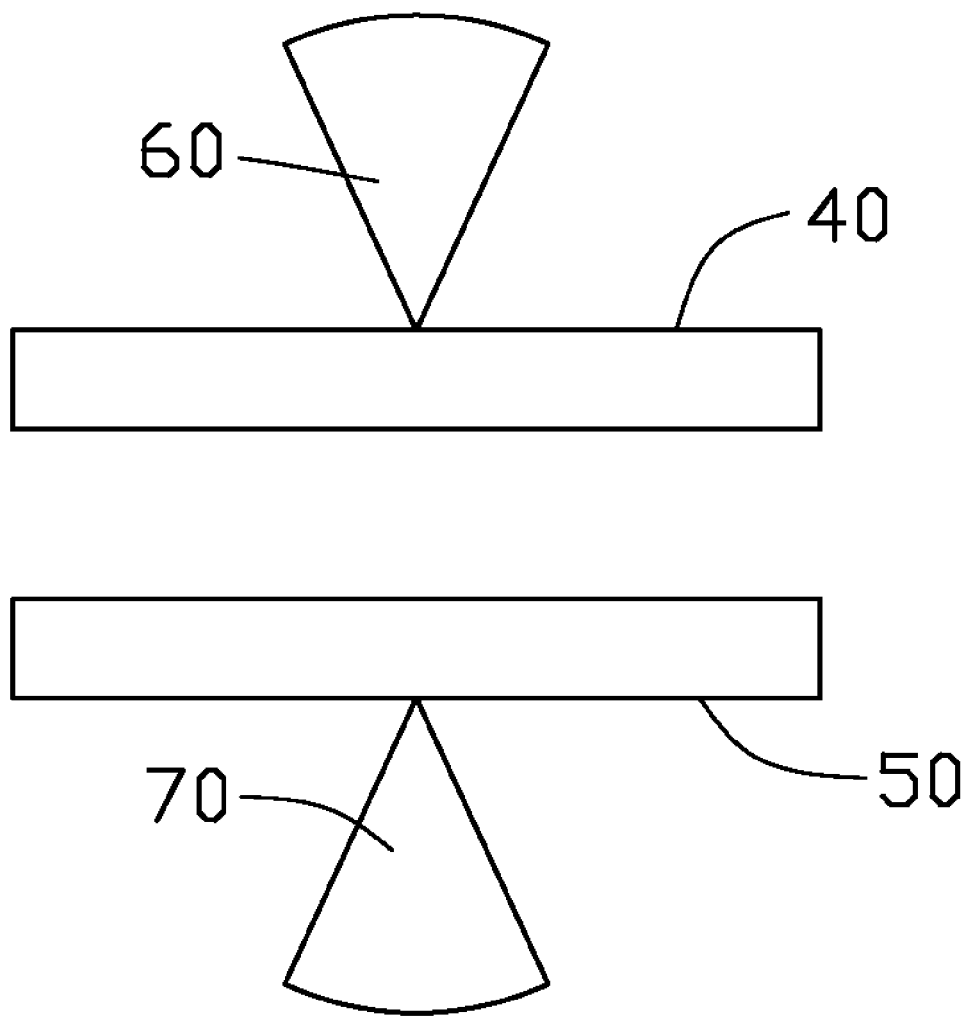
FIG. 7 is a plane schematic diagram of the directional coupler including two coupled lines in accordance with an embodiment of the present disclosure.

FIG. 7 shows a directional coupler in accordance with another embodiment of the present disclosure and includes two coupled lines 40 and 50. The two coupled lines 40 and 50 are arranged in parallel, wherein the length of each coupled line 40, 50 is 150 mils. The two sector metal plates 60 and 70 are connected to the outside of the two coupled lines 40 and 50. Apexes of the two sector metal plates 60 and 70 are connected to the outer sides of the middle portions of the two coupled lines 40 and 50, respectively. The bisector of the sector metal plate 60 is in alignment with the bisector of the sector metal plate 70. The two sector metal plates 60 and 70 are symmetric along a parallel central line between the coupled line 40 and the coupled line 50. Parameters of the two sector metal plates 60 and 70 are the same as the sector metal plate 30 of FIG. 2.

The present directional coupler reduces the length of the coupled line by extending out the sector metal plate, which is equivalent to the capacitor at the middle position of the coupled line of the directional coupler.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A directional coupler comprising two parallel coupled lines, and two sector metal plates connecting to a middle portion of each of the two coupled lines, wherein lengths of the two coupled lines are approximately 150 mil, radius lengths of the two sector metal plates are approximately 71.47 mil, and central angles of the sector metal plates are about 60 degrees.

2. The directional coupler as claimed in claim 1, the two sector metal plates comprises materials substantially similar to that of materials comprising the two coupled lines.

3. The directional coupler as claimed in claim 1, wherein the material of the two sector metal plates is copper.

4. The directional coupler as claimed in claim 1, wherein the two sector metal plates are symmetric along a parallel central line between the two coupled lines, and central lines of the two sector metal plate are aligned and perpendicular to the central line of the coupled lines.

5. The directional coupler as claimed in claim 1, wherein the two sector metal plates are connected to outer sides of the two coupled lines, and apexes of the two sector metal plates are connected to outer sides of middle portions of the two coupled lines.

* * * * *